US010608101B2

(12) United States Patent
Liu (10) Patent No.: US 10,608,101 B2
(45) Date of Patent: Mar. 31, 2020

(54) DETECTION CIRCUIT FOR PHOTO SENSOR WITH STACKED SUBSTRATES

(71) Applicant: Facebook Technologies, LLC, Menlo Park, CA (US)

(72) Inventor: Xinqiao Liu, Medina, WA (US)

(73) Assignee: FACEBOOK TECHNOLOGIES, LLC, Menlo Park, CA (US)

( * ) Notice: Subject to any disclaimer, the term of this patent is extended or adjusted under 35 U.S.C. 154(b) by 54 days.

(21) Appl. No.: 15/861,588

(22) Filed: Jan. 3, 2018

(65) Prior Publication Data
US 2019/0058058 A1 Feb. 21, 2019

Related U.S. Application Data

(60) Provisional application No. 62/546,485, filed on Aug. 16, 2017.

(51) Int. Cl.
*H01L 29/765* (2006.01)
*H01L 27/146* (2006.01)
*H03K 17/78* (2006.01)

(52) U.S. Cl.
CPC ........ *H01L 29/765* (2013.01); *H01L 27/1461* (2013.01); *H01L 27/14643* (2013.01); *H03K 17/78* (2013.01)

(58) Field of Classification Search
CPC ......... H01L 27/14634; H01L 27/14636; H01L 27/14638; H01L 27/14643;
(Continued)

(56) References Cited

U.S. PATENT DOCUMENTS 8,144,227 B2 * 3/2012 Kobayashi ............. H04N 5/379
348/308
8,773,562 B1 7/2014 Fan
(Continued)

FOREIGN PATENT DOCUMENTS

DE 202016105510 U1 10/2016

OTHER PUBLICATIONS

PCT International Search Report and Written Opinion, PCT Application No. PCT/US2018/045661, dated Nov. 30, 2018, 13 pages.
(Continued)

*Primary Examiner* — John R Lee
(74) *Attorney, Agent, or Firm* — Kilpatrick Townsend & Stockton LLP (57) ABSTRACT

Embodiments relate to a stacked photo sensor assembly where two substrates are stacked vertically. The two substrates are connected via interconnects at a pixel level to provide a signal from a photodiode at a first substrate to circuitry on a second substrate. The circuitry on the second substrate performs operations that were conventionally performed on first substrate. More specifically, charge storage of the first substrate is replaced with capacitors on the second substrate. A voltage signal corresponding to the amount of charge in the first substrate is generated and processed in the second substrate. By stacking the first and second substrates, the photo sensor assembly can be made more compact while increasing or at least retaining the photodiode fill factor of the photo sensor assembly.

21 Claims, 6 Drawing Sheets

(58) Field of Classification Search
CPC ........... H01L 27/14612; H01L 27/1464; H01L 27/14601; H01L 27/146; H01L 27/14603; H01L 27/14605; H01L 27/14609; H01L 27/1461; H01L 29/765; H04N 5/335; H04N 5/3355; H04N 5/379; H04N 5/369; H03K 17/785; H03K 17/78
See application file for complete search history.

(56) References Cited

U.S. PATENT DOCUMENTS

| | | | | |
|---|---|---|---|---|
| 8,946,610 | B2* | 2/2015 | Iwabuchi | H01L 23/481 250/208.1 |
| 9,343,497 | B2* | 5/2016 | Cho | H01L 27/14618 |
| 9,478,579 | B2* | 10/2016 | Dai | H01L 27/14609 |
| 10,003,759 | B2* | 6/2018 | Fan | H01L 27/14643 |
| 2003/0049925 | A1* | 3/2003 | Layman | H01L 24/81 438/614 |
| 2004/0095495 | A1* | 5/2004 | Inokuma | H04N 5/2253 348/308 |
| 2006/0023109 | A1* | 2/2006 | Mabuchi | H01L 24/17 348/340 |
| 2008/0088014 | A1* | 4/2008 | Adkisson | H01L 27/14618 257/737 |
| 2010/0276572 | A1* | 11/2010 | Iwabuchi | H01L 23/481 250/208.1 |
| 2011/0049589 | A1 | 3/2011 | Chuang et al. | |
| 2013/0020466 | A1* | 1/2013 | Ayers | H01L 27/14609 250/208.1 |
| 2013/0082313 | A1 | 4/2013 | Manabe | |
| 2013/0229560 | A1 | 9/2013 | Kondo | |
| 2014/0042582 | A1 | 2/2014 | Kondo | |
| 2014/0085523 | A1 | 3/2014 | Hynecek | |
| 2016/0037111 | A1 | 2/2016 | Dai et al. | |
| 2017/0053962 | A1* | 2/2017 | Oh | H01L 27/14614 |
| 2017/0104946 | A1 | 4/2017 | Hong | |
| 2019/0052788 | A1* | 2/2019 | Liu | H04N 5/2353 |
| 2019/0056264 | A1* | 2/2019 | Liu | G01J 1/44 |
| 2019/0057995 | A1* | 2/2019 | Liu | H01L 27/14634 |
| 2019/0058058 | A1* | 2/2019 | Liu | H01L 29/765 |

OTHER PUBLICATIONS

European Extended Search Report, European Application No. 18188968.4, dated Oct. 23, 2018, 8 pages.

European Application No. EP18188968.4, Office Action dated Aug. 14, 2019, 5 pages.

* cited by examiner

DETECTION CIRCUIT FOR PHOTO SENSOR WITH STACKED SUBSTRATES

CROSS REFERENCE TO RELATED APPLICATION

This application claims priority under 35 U.S.C. § 119(e) to U.S. Patent Application No. 62/546,485 filed on Aug. 16, 2017, which is incorporated by reference in its entirety.

BACKGROUND

Field of Technology

The present disclosure relates generally to optical sensors, and more particularly, to backside illumination optical sensors in stacked assembly.

Discussion of the Related Art

Optical sensors are electronic detectors that convert light into an electronic signal. In photography, a shutter is a device that allows light to pass for a determined period of time, exposing the optical sensors to the light in order to capture an image of a scene. Rolling shutter is a method of image capture in which a still picture or each frame of a video is captured by scanning across the scene rapidly in a horizontal or vertical direction. That is, every pixel is not captured at the same time; pixels from different rows are captured at different times. Rolling shutter is mostly used in cell phone sensors. Machine vision, in contrast, uses global shutter where every pixel is captured at the same time.

Most optical sensors use backside illumination. A back-illuminated sensor is a type of digital optical sensor that uses a particular arrangement of imaging elements to increase the amount of light captured, improving low-light performance. A traditional front-illuminated digital camera is constructed similarly to the human eye, with a lens at the front and photodetectors at the back. This orientation of the sensor places the active matrix of the digital camera sensor, a matrix of individual picture elements, on its front surface and simplifies manufacturing. The matrix and its wiring, however, reflect some of the light, reducing the signal that is available to be captured. A back-illuminated sensor contains the same elements, but arranges the wiring behind the photocathode layer by flipping the silicon wafer during manufacturing and then thinning its reverse side so that light can hit the photocathode layer without passing through the wiring layer, thereby improving the chance of an input photon being captured.

However, there are problems associated with conventional back-illuminated sensors. Storage is exposed to light, which causes higher leakage. Also, the photodiode fill factor, or the ratio of light-sensitive area of a pixel to total pixel area, is low. A large fill factor is ideal because more of the pixel area is used for photocollection, which simultaneously improves signal-to-noise ratio (SNR) and dynamic range. The dynamic range of an image sensor measures how wide of a range of lighting the sensor can accurately capture. The wider the dynamic range of the image sensor, the more details can be shown when the image is captured under both high light and low light conditions simultaneously and thus the more versatile the imaging system becomes. The SNR of an image sensor measures the ratio between the signal and its associated noise. An image sensor with low SNR will have a high amount of noise appearing in the captured image. An image sensor with low noise can produce better image in low light conditions. Due to problems associated with existing back-illuminated sensors, an improved photo assembly would be desirable.

SUMMARY

Embodiments relate to a pixel of a photo sensor with stacked substrates and a pixel level interconnect that connects circuits in the stacked substrates. The pixel may include a portion of a first substrate, a portion of a second substrate having a circuit for processing a signal from the first substrate; and the pixel level interconnect. The portion of the first substrate includes a photodiode, a floating diffusion point, and a first transistor between the photodiode and the floating diffusion point to transfer charge from the photodiode to the floating diffusion point responsive to turning on the first transistor. The amount of charge stored in a diffusion well depends on duration and intensity of the light incident on the photodiode. The portion of the second substrate includes a current source, a conductive line, a first switch selectively coupling the conductive line to the floating diffusion point, and a first capacitor configured to store a signal voltage responsive to turning on the first switch, the second substrate overlapping the first substrate, the signal voltage representing an amount of charge transferred from the photodiode to the floating diffusion point. The pixel level interconnect connects the second well of the first substrate to the circuit of the second substrate to carry the signal from the floating diffusion point to the conductive line.

DETAILED DESCRIPTION OF THE PREFERRED EMBODIMENTS

Reference will now be made in detail to the preferred embodiment, an example of which is illustrated in the accompanying drawings. Whenever possible, the same reference numbers will be used throughout the drawings to refer to the same or like parts.

Embodiments relate to a stacked photo sensor assembly where two substrates that are stacked vertically. The two substrates are connected via interconnects at a pixel level to provide a signal from a photodiode at a first substrate to circuitry on a second substrate. The circuitry on the second substrate performs operations that were conventionally performed on first substrate. More specifically, charge storage of the first substrate is replaced with capacitors on the second substrate. A voltage signal corresponding to the amount of charge in the first substrate is generated and processed in the second substrate.

Example System Architecture

Figure 1:
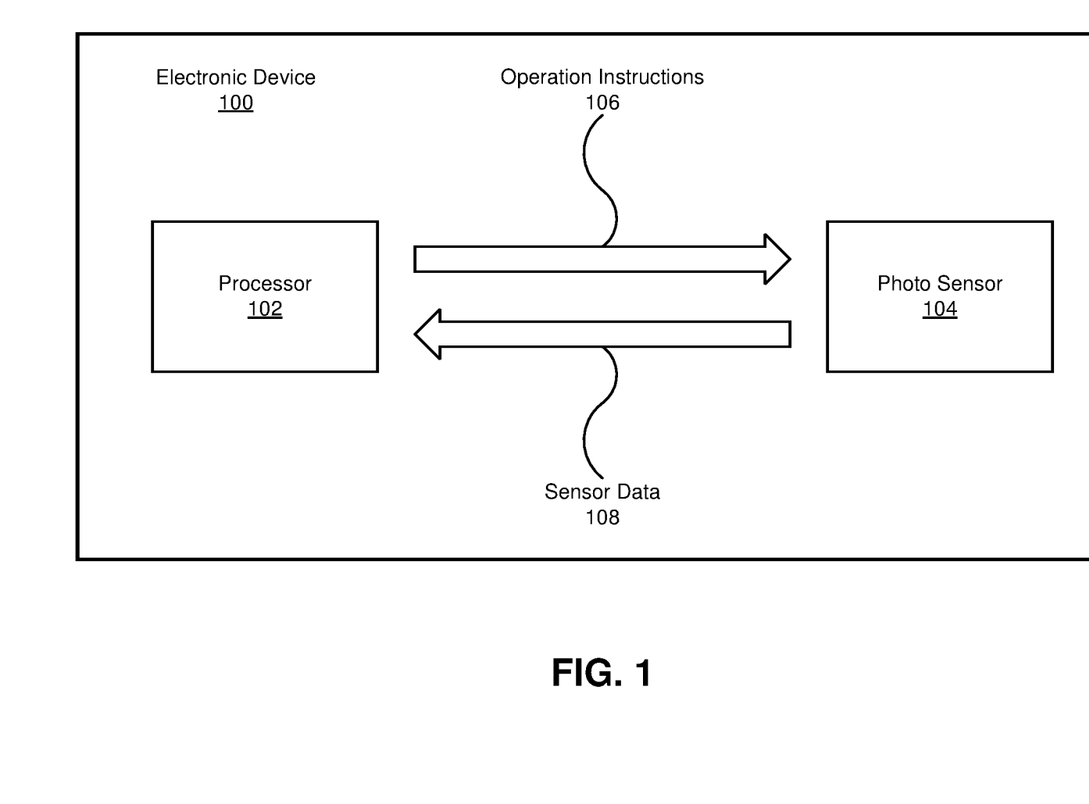
FIG. 1 is a high-level block diagram illustrating the electronic device, according to one embodiment.

FIG. 1 is a high-level block diagram illustrating the electronic device, according to one embodiment. In one embodiment, the electronic device 100 includes, among other components, a processor 102 and a photo sensor 104 that are commutatively coupled. The electronic device 100 may include other components not illustrated in FIG. 1 such as memory and various other sensors.

The processor 102 is an electronic circuit that performs operations on a data source. The data source may include the photo sensor 104 that provides sensor data 108. The processor 102 generates operation instructions 106 that are sent to the photo sensor 104. The processing performed by the processor 102 may include an analog-digital conversion of the sensor data 108, which converts voltage analog signals or current analog signals into digital signals.

The photo sensor 104 is a circuit that measures light intensity and performs a photoconversion. Measuring light intensity may involve detecting light by a photodiode and the photoconversion may involve converting the light by the photodiode into a voltage or current signal.

Figure 2:
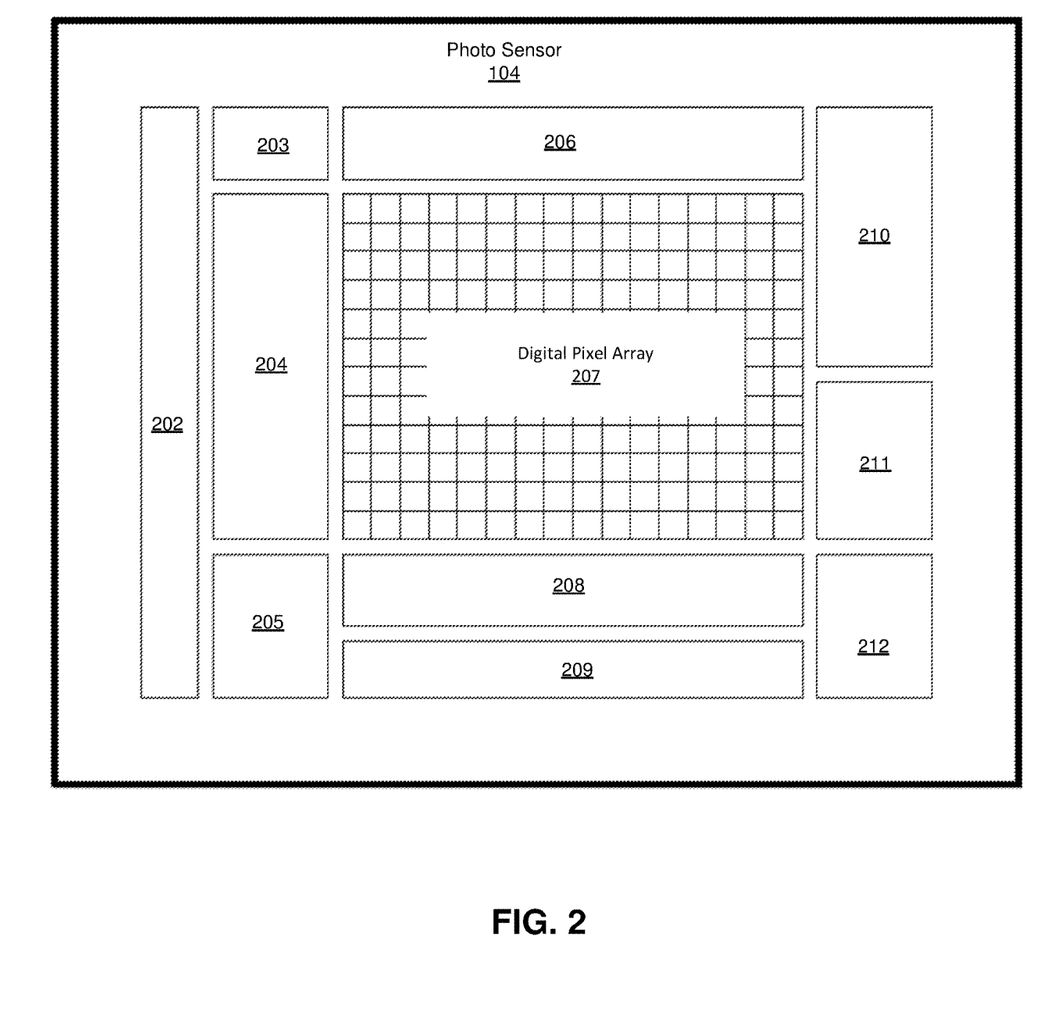
FIG. 2 is a view illustrating the sensor architecture, according to one embodiment.

FIG. 2 is a schematic view illustrating the photo sensor 104, according to one embodiment. The photo sensor 104 includes, among other components, a digital block 202, a global counter 203, a row drivers and global signal drivers module 204, Mobile Industry Processor Interface (MIPI) 205, counter buffers 206, a digital pixel array 207, sense amplifiers 208, a line memory 209, a power conditioner 210, a ramp generation and buffers module 211, and a sense amplification biasing module 212.

The digital block 202 is a circuit that processes digital signals associated with the operation of the photo sensor 104. In one or more embodiments, at least part of the digital block 202 may be provided as part of the digital pixel array 207 instead of being a circuit separate from the digital pixel array 207.

The global counter 203 is a digital sequential logic circuit constructed of cascading flip-flops, and provides counter signals to various components of the photo sensor 104.

The row drivers and global signal drivers module 204 is a circuit that provides signals to rows of pixels via scan lines (not shown). The signal provided to each row of pixels indicates sensing of image signal and/or resetting operations at each row of pixels.

MIPI 205 is a serial interface for transmitting the sensor data 108 from the photo sensor 104 to the processor 102. An MIPI interface typically has a single clock lane and one or more data lanes (not shown) that carry serial data. These lanes carry signals on pairs of wires where the signals are often differential.

The counter buffers 206 is a circuit that receives counter signals from the global counter 203, and sends signals to columns of pixels in the digital pixel array 207 to coordinate sensing and resetting operations.

The digital pixel array 207 includes a plurality of pixels. In one embodiment, the digital pixel array is arranged in two dimensions, addressable by row and column. Each pixel is configured to sense light and output a signal corresponding to the intensity of the input light. Each pixel may include components as described below with reference to FIG. 3.

The sense amplifiers 208 are elements in the read circuitry that are used to the read out of the digital signals from the digital pixel array 207. The sense amplifiers 208 sense low power signals from a bitline that represents the intensity of light captured by the pixels in the digital pixel array 207. The sense amplifiers 208 may generate a digital output signal by utilizing an analog-to-digital converter (ADC). In one or more embodiments, at least part of the sense amplifiers 208 may be included in the digital pixel array 207.

The line memory 209 temporarily stores the sensed digital values of the light intensity detected at the digital pixel array 207, as sensed by the sense amplifiers 208 and processed by digital block 202 before sending the digital values to the processor 102 via MIPI 205 as the sensor data 108.

The power conditioner 210 is a circuit that improves the quality of the power that is delivered to components of the photo sensor 104. The power conditioner 210 may maintain and deliver a constant voltage that allows the components of the photo sensor 104 to function properly. In one embodiment, the power conditioner 210 is an AC power conditioner which smoothes the sinusoidal AC waveform. In alternate embodiments, the power conditioner 210 is a power line conditioner which takes in power and modifies it based on the requirements of the components connected to the power line conditioner.

The ramp generator and buffers module 211 comprises a ramp generator and buffers. The ramp generator is a function generator that increases its voltage to a particular value. The ramp generator may be used to avoid jolts when changing a load. The buffers provide electrical impedance transformation from one circuit to another to prevent the ramp generator from being affected by the load.

The sense amplification biasing module 212 provides biasing voltage signal to the sense amplifiers 208. The biasing voltage signal is a predetermined voltage for the purpose of establishing proper operating conditions of the sense amplifiers 208 such as a steady DC voltage.

Example Stacked Photo Sensor Assembly

Figure 3:
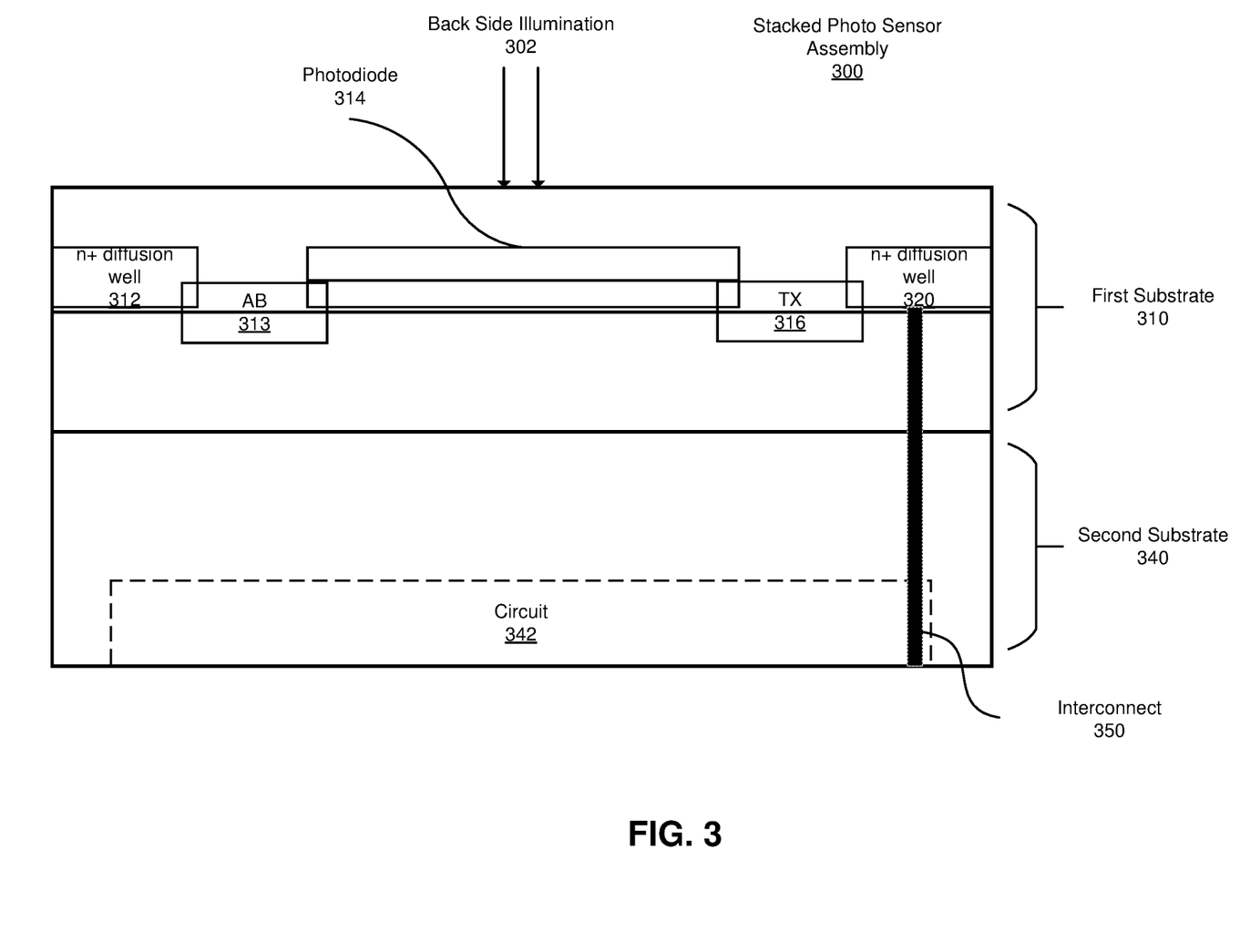
FIG. 3 is a cross-sectional view illustration the stacked photo assembly, according to one embodiment.

FIG. 3 is a cross-sectional view illustrating the stacked photo sensor assembly 300, according to one embodiment. In one embodiment, the stacked photo assembly includes a first substrate 310 coupled to a second substrate 340. The first substrate 310 may be a back-side illumination 302 sensor that is flipped over and includes, among other components, a first n+ diffusion well 312, a photodiode 314, a transistor AB 313, a transistor TX 316, and a second n+ diffusion well 320.

Each of transistor AB 311 and transistor TX 316 includes an active layer, a drain electrode coupled to the active layer, a photodiode 314 that serves as a source of both transistor AB and transistor TX, an insulation layer over the active layer, and a gate electrode (not shown). By controlling a voltage level at the gates of the transistors AB 311 and the transistor TX 316, the transistors AB 311 and the transistor TX 316 can be turned on or off. The gates of these transistors receive signals from circuits external to the digital pixel array 207.

The first n+ diffusion well 312 is an N doped implant region formed in the first substrate 310. The first n+ diffusion well 312 receives photoelectrons that are transferred from the photodiode 314 when transistor AB 313 is turned on during non-exposure times. This is equivalent to a closed shutter mode in a traditional film camera. The transfer of photoelectrons from the photodiode 314 to the first n+ diffusion well 312 ensures that no photoelectrons are accumulated on the photodiode 314, as the non-exposure times are periods when no signal is generated. The first n+ diffusion well 312 is typically connected to a positive voltage source, for example VDD, so the photoelectrons are drained away. During an exposure time, which is equivalent to the shutter open mode in a film camera, both transistor AB 313 and transistor TX 316 are turned off and the photoelectrons are initially stored inside the photodiode 314. At the end of exposure, transistor TX 316 is turned on. As a result, the charge stored in the photodiode 314 is transferred to the second n+ diffusion well 320.

The photodiode 314 is a semiconductor device that converts light into an electric current. Current is generated when photons are absorbed in the photodiode 314. The photodiode 314 may be a p-n junction or PIN structure. When the intensity of light through back-side illumination 302 is higher, the amount of charge accumulated on the photodiode 314 is high. Similarly, when the intensity of light through back-side illumination 302 is lower, the amount of charge accumulated on the photodiode 314 is low.

The interconnect 350 may be a pixel level direct interconnect from the second n+ diffusion well 320 to a circuit 342 in the second substrate 340. In one embodiment, the interconnect 350 transmits a voltage signal that reflects the amount of charge transferred from the photodiode 314 to the second n+ diffusion well 320. In alternative embodiments, the interconnect 350 transmits a current signal that reflects the amount of charge transferred from the photodiode 314 to the second n+ diffusion well 320. The interconnect 350 carries the voltage signal to the circuit 342 for further processing such as sampling and analog-to-digital conversion. In still other embodiments, the stacked photo sensor assembly 300 may include additional interconnects that also transmit signals from the circuit 342 of the second substrate 340 to the first substrate 310. For example, signals for controlling transistor AB 313 and transistor TX 316 may be transmitted from the circuit 342 via these additional interconnects.

Embodiments move various circuit components provided on the first substrate 310 in conventional photo sensors to the second substrate 340, and connect the circuits of the second substrate 340 to the components in the first substrate 310 via the pixel level interconnect 350. The various circuit components moved to the second substrate 340 may include, among others, switches, amplifiers and current source. In this way, the area occupied by other than photodiode components in the first substrate 310 can be beneficially reduced and the fill factor can be increased.

Example Circuitry of a Pixel of the Photo Sensor

Figure 4:
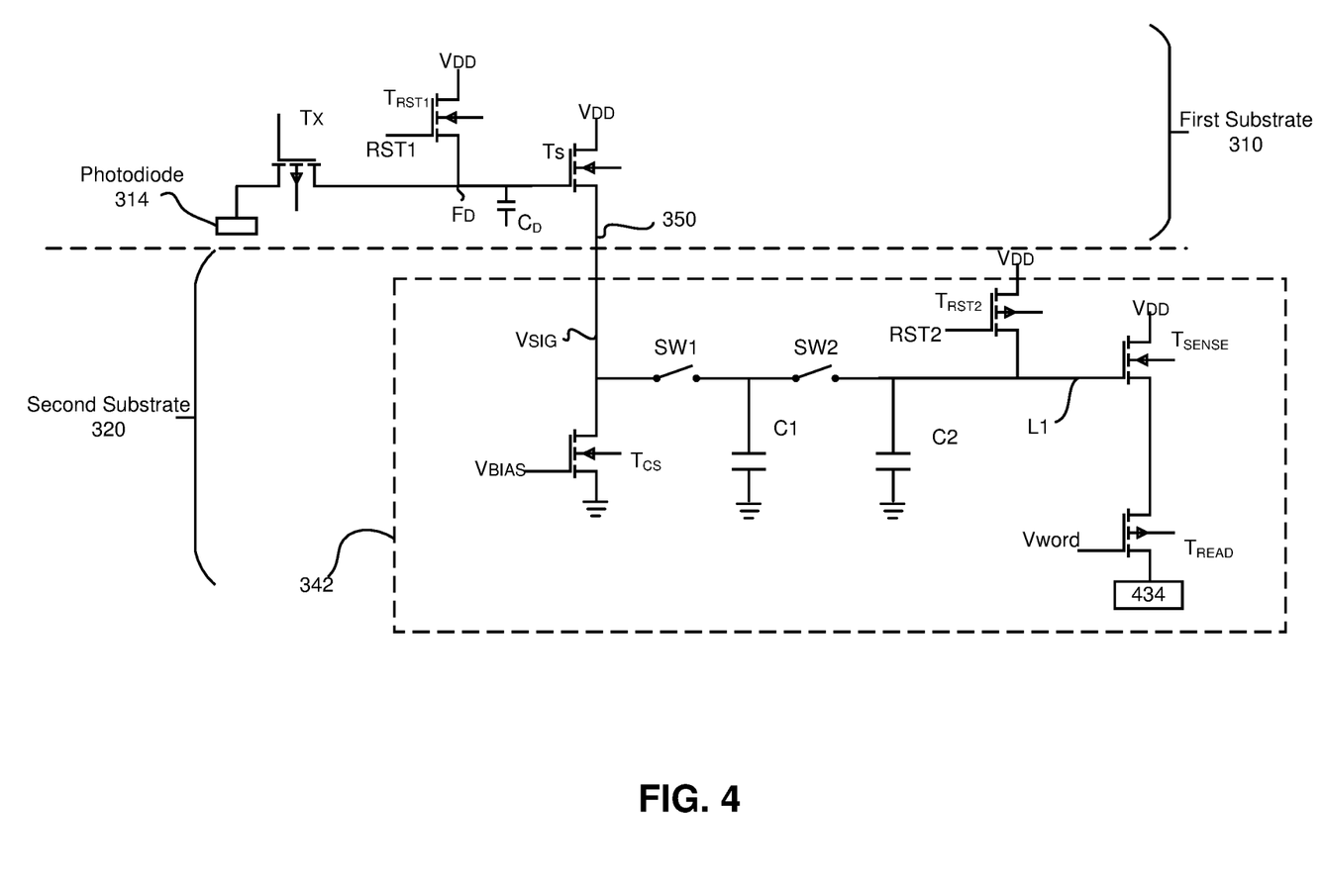
FIG. 4 is a circuit diagram illustrating the circuitry of a pixel of the photo sensor, according to one embodiment.

FIG. 4 is a circuit diagram illustrating the circuitry of a pixel of the photo sensor 104, according to one embodiment. In the embodiment of FIG. 4, the first substrate 310 includes, among other components, the photodiode 314, a first transistor TX, a first reset transistor $T_{RST1}$, and an amplifier $T_S$. Parasitic capacitance $C_D$ is also present in the first substrate 310 between the transistor $T_{RST1}$ and the amplifier $T_S$. The operation of the photodiode 314 and the first transistor TX is described above in detail with reference to FIG. 3.

The first reset transistor $T_{RST1}$ functions to reset the voltage at floating diffusion point $F_D$ when the first reset transistor $T_{RST1}$ is turned on. The first reset transistor $T_{RST1}$ is turned on when a reset signal RST1 is received at the gate of the first reset transistor $T_{RST1}$ before each cycle of exposure and sensing. The drain of the first reset transistor $T_{RST1}$ is connected to a voltage source VDD. The source of the first reset transistor $T_{RST1}$ is connected to the floating diffusion point $F_D$.

The voltage level at the floating diffusion point $F_D$ serves as a proxy that indicates the duration and/or intensity of light exposure of the photodiode 314 during an exposure phase. The floating diffusion point $F_D$ is connected to the second n+ diffusion well 320. As the charge is transferred from the photodiode 314 to the floating diffusion point $F_D$ via the first transistor TX, the voltage level at the floating diffusion point $F_D$ is decreased from the original reset voltage level. The voltage change on the floating diffusion node is proportional to the charge transferred from the photodiode. When the duration and/or intensity of light exposure of the photodiode 314 during the exposure phase is increased, the voltage change at the floating diffusion point $F_D$ is also increased. When the duration and/or intensity of light exposure of the photodiode 314 during the exposure phase is decreased, the voltage change at the floating diffusion point $F_D$ is also decreased.

The amplifier $T_S$ is a source follower amplifier that amplifies its gate signal to generate a voltage signal $V_{SIG}$ that is transmitted to the circuit 342. The gate of the amplifier $T_S$ is connected to the floating diffusion point $F_D$. The drain of the amplifier $T_S$ is connected to a voltage source VDD. The source of the amplifier $T_S$ is connected to the interconnect 350. The voltage signal $V_{SIG}$ corresponds to the voltage level at the floating diffusion point $F_D$.

The second substrate 340 includes the circuit 342 that processes signals based on the voltage signal $V_{SIG}$. The circuit 342 includes, among other components, a current source $T_{CS}$, a first switch SW1, a second switch SW2, a second reset transistor $T_{RST2}$, a sense transistor $T_{SENSE}$, and a read transistor $T_{READ}$.

The current source $T_{CS}$ operates as a current source when turned on. In one embodiment, the gate of current source $T_{CS}$ is applied with a pulse of bias voltage $V_{BIAS}$ at the start of the readout phase, as described below in detail with reference to FIG. 5 in order to turn on and off the current source $T_{CS}$. The current source $T_{CS}$ is turned on only during the readout phase and is turned off when the pixel is not in the readout phase to save power. The drain of the current source $T_{CS}$ is connected to the interconnect 350 and the source of the current source $T_{CS}$ is grounded.

The second reset transistor $T_{RST2}$ resets the voltage at a terminal of the second in-pixel capacitor C2 when it is turned on. While the second switch SW2 is turned off, reset signal $R_{ST2}$ is provided to the gate of the second reset transistor $T_{RST2}$ to reset and store the reset voltage $V_{RST2}$ at the terminal of the second in-pixel capacitor C2. In this embodiment where a PMOS type is used as the second reset transistor $T_{RST2}$, the source of the second reset transistor $T_{RST2}$ is connected to a voltage source VDD. The drain of the second reset transistor $T_{RST2}$ is connected to conductive line L1. The second reset transistor $T_{RST2}$ is also used to reset the first in-pixel capacitor C1 when the second switch SW2 is turned on.

The sense transistor $T_{SENSE}$ is a source follower amplifier that amplifies the voltage $V_{SIG}$ transmitted over conductive line L1. The gate of the sense transistor $T_{SENSE}$ is connected to conductive line L1. The source of the sense transistor $T_{SENSE}$ is connected to the read transistor $T_{READ}$.

The read transistor $T_{READ}$ is turned on when a word line signal $V_{WORD}$ turns active, enabling the amplified version of the voltage at conductive line L1 to be sent to a pixel value readout circuit 434 located outside the pixel.

In alternate embodiments, the amplifiers or current sources are replaced with various other circuits that are not shown in FIG. 4. Alternatively, in one embodiment, the circuit 342 does not include the second reset transistor $T_{RST2}$.

Example Timing Diagram

Figure 5:
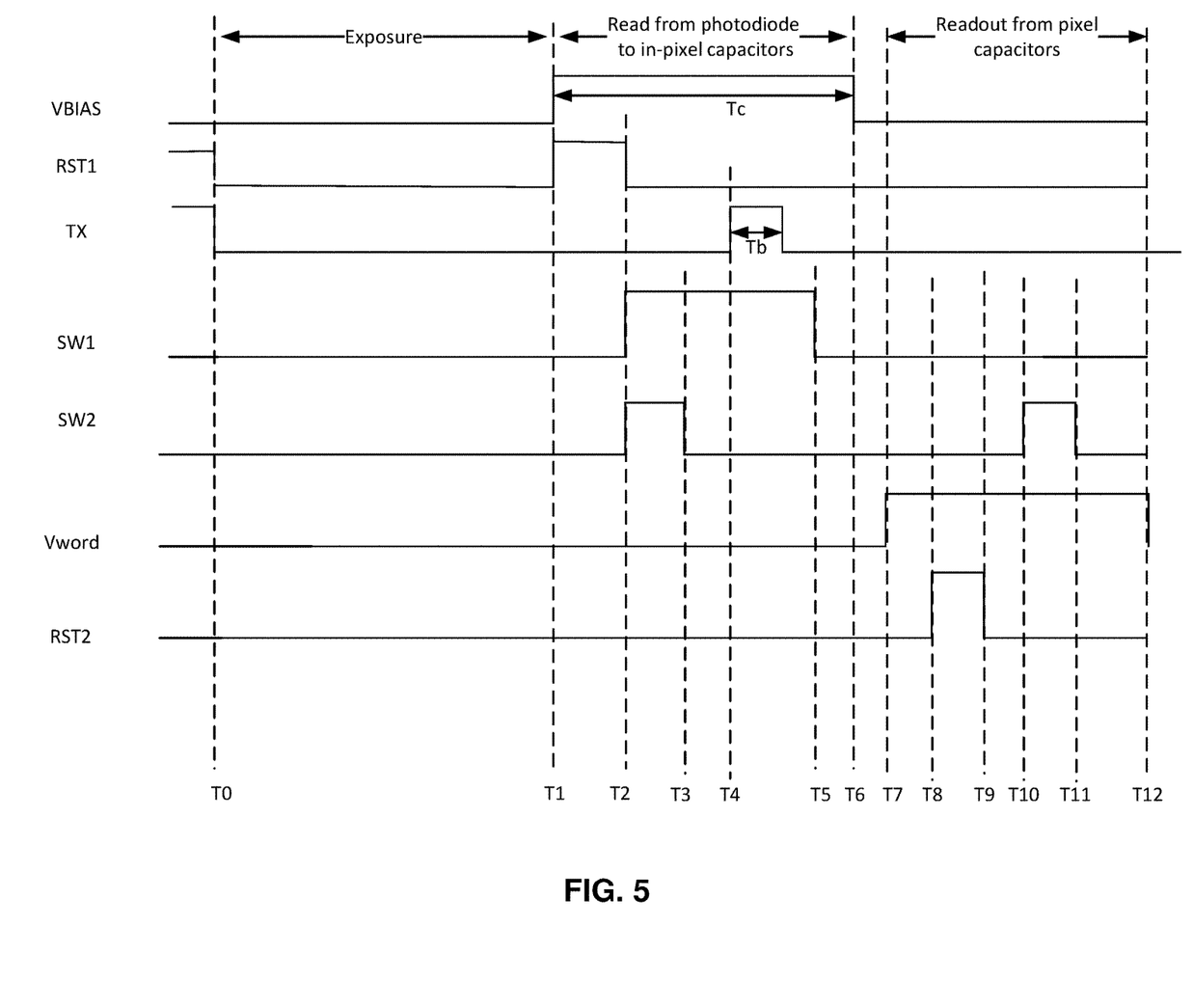
FIG. 5 is a timing diagram illustrating signals associated with the operation of a photo sensor pixel, according to one embodiment.

FIG. 5 is a timing diagram illustrating signals associated with the operation of a photo sensor pixel, according to one embodiment. A cycle of the pixel operation is divided into an exposure phase and a readout phase. The readout phase is further divided into a readout from the photodiode to in-pixel capacitors C1, C2 and a readout from the in-pixel capacitors C1, C2 to outside of the digital pixel array through the read transistor $T_{READ}$. During the exposure phase, the photodiode 314 accumulates charge. During the readout phase, the accumulated charge in the photodiode 314 is converted to the voltage signal $V_{SIG}$ and processed through the circuit 342.

The gate voltage $R_{ST1}$ of the first reset transistor $T_{RST1}$ is high before exposure, turns low at time T0 at which the exposure phase starts, remains low throughout the exposure phase, and turns high again at the start of the readout phase. When the first reset transistor $T_{RST1}$ is turned on, the voltage level at the floating diffusion point $F_D$ is reset to a predetermined voltage.

The first transistor TX is turned off at time T0 and remains turned off during the exposure phase. Then, the first transistor TX is turned on at time T4 and remains turned on for an amount of time Tb to enable charge accumulated in the photodiode 314 to transfer to the floating diffusion point $F_D$. The voltage change on the floating diffusion point $F_D$ corresponds to the amount of charge accumulated in the photodiode 314 and parasitic capacitance $C_D$ on the floating diffusion point $F_D$. Then, the first transistor TX is turned off throughout the remaining readout phase.

Bias voltage $V_{BIAS}$ is turned active at time T1, which indicates the start of the readout phase to turn on the transistor $T_{CS}$. The current source $T_{CS}$ remains turned on for an amount of time $T_C$ and is then turned off. By turning on the current source $T_{CS}$ only for the amount of time $T_C$ instead of the entire readout phase, the power consumption of the circuit 342 can be reduced. The time $T_C$ is the readout phase where the signal from the photodiode 314 is read into in-pixel capacitors C1, C2.

In this readout phase, the first switch SW1 and the second switch SW2 are turned on at time T2. At time T3, the second switch SW2 is turned off to store the reset voltage $V_{RST1}$ in the second in-pixel capacitor C2. Time T3 is before time T4, which is at the time when the first transistor TX gate is turned on and charge is transferred from the photodiode 314 onto the floating diffusion point $F_D$.

Once the first transistor TX gate is turned off and the charge transfer is finished, the first switch SW1 is turned off at time T5. The voltage signal on the floating diffusion $F_D$ node $V_{SIG}$ is stored in the first capacitor C1. After storing the voltage signal $V_{SIG}$ in the first in-pixel capacitor C1 and $V_{RST1}$ voltage in the second in-pixel capacitor C2, at time T6, bias voltage $V_{BIAS}$ is turned low and the sensor is finished with the readout from the photodiode 314 to in-pixel capacitors C1, C2. This first readout phase is performed simultaneously for all the pixels in the array, hence this is a global shutter operation.

The second readout from the in-pixel capacitors C1, C2 to outside of the digital pixel array may occur at a later time, and this is typically performed one row of pixels at a time. The second readout starts at time T7, where the word line signal $V_{WORD}$ signal is high and the read transistor $T_{READ}$ and the sense transistor $T_{SENSE}$ are turned on. The pixel reset voltage $V_{RST1}$ stored on the second in-pixel capacitor C2 is readout first to the pixel value readout circuit 434, then at time T8, the second reset transistor $T_{RST2}$ is turned on and the voltage on the second in-pixel capacitor C2 is reset to a known voltage level $V_{RST2}$. The second reset transistor $T_{RST2}$ is turned off at time T9. Afterward, at time T10, the second switch SW2 is turned on. As a result, the voltage $V_{OUT}$ at conductive line L1 becomes the following:

$$V_{OUT}=(V_{SIG} \cdot C1 + V_{RST2} \cdot C1)/(C1+C2) \qquad (1)$$

Since the read transistor $T_{READ}$ is on when the word line signal $V_{WORD}$ is applied to the read transistor $T_{READ}$, the voltage $V_{OUT}$ is provided to the pixel value readout circuit 434.

One of many advantages of the embodiments is that the first substrate 310 does not include a storage capacitor for storing the charge transferred from the photodiode 314 when the first transistor TX is turned on. Because the storage capacitor is not required in the first substrate, the fill factor of the photo sensor can be increased.

Example Process Flow

Figure 6:
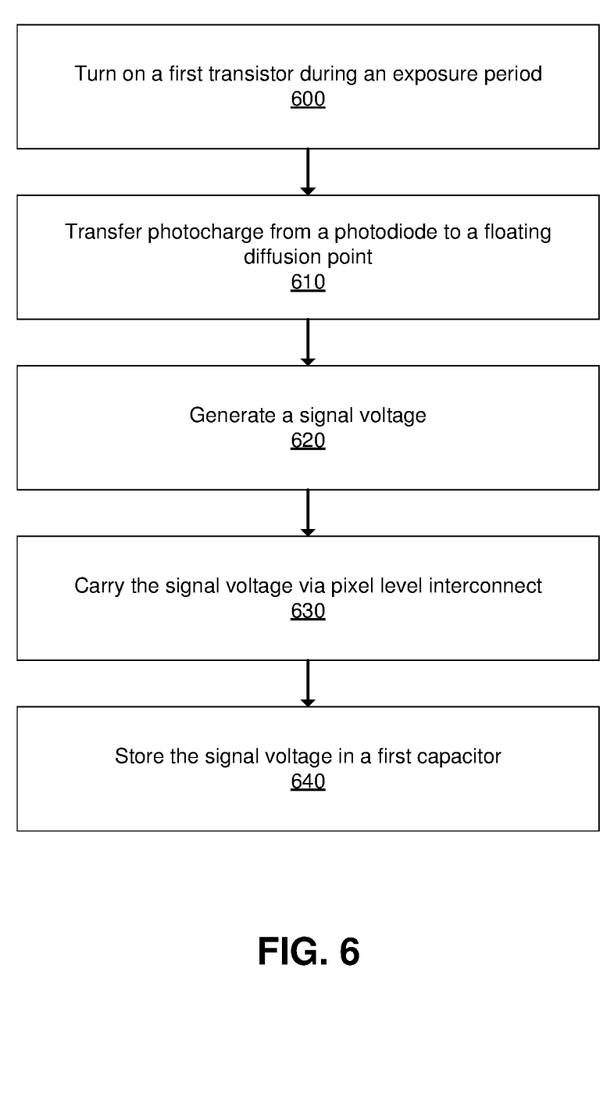
FIG. 6 is a process flow diagram illustrating a method for operating a pixel, according to one embodiment.

FIG. 6 is a process flow diagram illustrating a method for operating a pixel, according to one embodiment. Before the exposure phase T0, the first transistor TX and the first reset transistor $T_{RST1}$ are turned on. A first reset signal $R_{ST1}$ is applied to turn on the first reset transistor $T_{RST1}$. When the first reset transistor $T_{RST1}$ is turned on 600, the voltage level at the floating diffusion point $F_D$ is reset to a predetermined level.

The exposure period begins at T0. During the exposure period, the photodiode accumulates charge. The first transistor TX is turned off and remains turned off during the exposure phase to prevent the transfer of charge from the photodiode. The first reset transistor $T_{RST1}$ is also turned off.

The readout phase begins at time T1. The readout phase is divided into readout from the photodiode to in-pixel capacitors C1, C2 (time T1 to T5) and readout from the in-pixel capacitors C1, C2 to outside of the digital pixel array (time T7 to T12), as described above with reference to FIG. 5. During the readout from the photodiode to in-pixel capacitors C1, C2 the first transistor TX is turned on 600 and charge is transferred 610 from the photodiode to the floating diffusion point $F_D$.

The signal voltage $V_{SIG}$ is generated 620 at the first substrate. The signal voltage $V_{SIG}$ corresponds to the voltage level at the floating diffusion point $F_D$.

Bias voltage $V_{BIAS}$ applied to the current source $T_{CS}$ is turned active at the start of the readout from the photodiode to in-pixel capacitors C1, C2 and enables the pixel level interconnect to carry the signal voltage $V_{SIG}$ from the amplifier $T_S$. The current source $T_{CS}$ remains turned on for an amount of time $T_C$. During time $T_C$, the signal voltage $V_{SIG}$ is carried 630 between the floating diffusion point $F_D$ and the conductive line via the pixel level interconnect and stored 640 into in-pixel capacitors C1 and C2. Then, the second switch SW2 is turned off to store the reset voltage $V_{RST1}$ of the floating diffusion point $F_D$ in the second in-pixel capacitor C2.

After storing the voltage signal $V_{SIG}$ in the first in-pixel capacitor C1 and reset voltage $V_{RST1}$ in the second in-pixel capacitor C2, the sensor is finished with the readout from the photodiode to in-pixel capacitors C1, C2.

During the second readout from the in-pixel capacitors C1, C2 to outside of the digital pixel array, the reset voltage $V_{RST1}$ stored on the second in-pixel capacitor C2 is readout first to the pixel value readout circuit 434. Then, the second reset transistor $T_{RST2}$ is turned on and the voltage on the second in-pixel capacitor C2 is reset to a known voltage level $V_{RST2}$. As a result, an output voltage $V_{OUT}$ at the conductive line L1 can be described in terms of the signal voltage $V_{SIG}$ stored in the first in-pixel capacitor C1 and the reset voltage $V_{RESET}$ stored in the second in-pixel capacitor C2, as shown in equation 1.

Word line signal $V_{WORD}$ is applied to the read transistor $T_{READ}$ to provide the output voltage $V_{OUT}$ to the pixel value readout circuit. The output voltage $V_{WORD}$ is processed by the pixel value readout circuit.

The language used in the specification has been principally selected for readability and instructional purposes, and it may not have been selected to delineate or circumscribe the inventive subject matter. It is therefore intended that the scope of the patent rights be limited not by this detailed description, but rather by any claims that issue on an application based hereon. Accordingly, the disclosure of the embodiments is intended to be illustrative, but not limiting, of the scope of the patent rights, which is set forth in the following claims.

What is claimed is:

1. A pixel in a photo sensor, comprising:
a portion of a first substrate including a photodiode, a floating diffusion point, a first transistor between the photodiode and the floating diffusion point to transfer charge from the photodiode to the floating diffusion point responsive to turning on the first transistor, and a second transistor configured as a source follower to buffer a signal voltage of the floating diffusion point;
a pixel level interconnect; and
a portion of a second substrate including a current source coupled with the second transistor via the pixel level interconnect, a first capacitor, a first switch selectively coupling the pixel level interconnect to the first capacitor, the current source configured to bias the second transistor via the pixel level interconnect, the first capacitor configured to receive the buffered signal voltage via the pixel level interconnect and store the buffered signal voltage responsive to turning on the first switch, the second substrate overlapping the first substrate, the signal voltage representing an amount of charge transferred from the photodiode to the floating diffusion point.

2. The pixel of claim 1, wherein the portion of the second substrate further comprises a second capacitor and a second switch selectively coupling the first capacitor with the second capacitor, the first capacitor and the second capacitor configured to store, respectively, a first reset voltage and a second reset voltage responsive to turning on the first switch and turning on the second switch.

3. The pixel of claim 2, wherein the first switch is turned on and the second switch is turned off to store the buffered signal voltage in the first capacitor, after both the first switch and the second switch are turned on.

4. The pixel of claim 2, wherein the first substrate further comprises a first reset switch configured to reset a voltage at the floating diffusion point responsive to turning on the first reset switch after an exposure period; and
wherein the first capacitor stores the first reset voltage when the floating diffusion point is reset responsive to turning on the first reset switch.

5. The pixel of claim 4, wherein the second substrate further comprises:
a second reset switch configured to store the second reset voltage at the second capacitor responsive turning on of the second reset switch; and
a sense transistor having a gate is connected to the second capacitor and configured to sense a second voltage at the second capacitor generated from the buffered signal voltage at the pixel level interconnect and from the second reset voltage.

6. The pixel of claim 5, wherein the second switch is turned off to store the second reset voltage in the second capacitor.

7. The pixel of claim 5, wherein the second substrate further comprises:
a read transistor configured to output the second voltage sensed by the sense transistor to a readout circuit outside the pixel.

8. The pixel according to claim 1, wherein the floating diffusion point is configured to reset after each cycle of an exposure period and a sensing period.

9. The pixel according to claim 1, wherein the current source is turned on during a portion of a sensing period subsequent to an exposure period and turned off during a remaining portion of the sensing period.

10. A method for operating a pixel, the method comprising:
turning on a first transistor during an exposure period;
transferring charge from a photodiode to a floating diffusion point in a first substrate responsive to turning on the first transistor;
generating a signal voltage at the first substrate, the signal voltage representing an amount of charge transferred from the photodiode to the floating diffusion point;
buffering the signal voltage with a second transistor in the first substrate, the second transistor being configured as a source follower and biased by a current source in a second substrate via a pixel level interconnect that couples between the second transistor and the current source;
carrying, via the pixel level interconnect, the buffered signal voltage from the second transistor to a first capacitor in the second substrate; and
storing the buffered signal voltage in the first capacitor in the second substrate responsive to turning on a first switch, the second substrate overlapping the first substrate.

11. The method of claim 10, wherein the second substrate further comprises a second capacitor and a second switch selectively coupling the first capacitor with the second capacitor, the method further comprising:
storing a first reset voltage in both the first capacitor and the second capacitor responsive to turning on the second switch.

12. The method of claim 11, the method further comprising:
storing the buffered signal voltage in the first capacitor responsive to turning on the first switch and turning off the second switch, after both the first switch and the second switch are turned on.

13. The method of claim 11, the method further comprising:
resetting a voltage at the floating diffusion point responsive to turning on a first reset switch in the first substrate after the exposure period; and
storing the first reset voltage at the first capacitor when the floating diffusion point is reset responsive to turning on the first reset switch.

14. The method of claim 13, the method further comprising:
storing a second reset voltage in the second capacitor responsive to turning on a second reset switch in the second substrate; and
sensing, using a sense transistor, a second voltage at the second capacitor generated from the buffered signal voltage at the pixel level interconnect and from the second reset voltage.

15. The method of claim 14, the method further comprising:
transferring the sensed second voltage at the pixel level interconnect to a readout circuit outside the pixel via a read transistor.

16. The method of claim 10, the method further comprising:
resetting the floating diffusion point after each cycle of an exposure period and a sensing period.

17. The method of claim 10, the method further comprising:
turning on the current source during a portion of a sensing period subsequent to an exposure period; and
turning off the current source during a remaining portion of the sensing period.

18. The pixel of claim 2, wherein both the first switch and the second switch are disabled during an exposure period in which the photodiode accumulates the charge.

19. The pixel of claim 18, wherein the first switch and the second switch are controlled to first store the first reset voltage at the second capacitor and then store a second voltage at the second capacitor, the second voltage being based on the second reset voltage and the buffered signal voltage.

20. The pixel of claim 19, wherein after the exposure period ends:
in a first read out period:
the first switch and the second switch are turned on to store the first reset voltage at both the first capacitor and the second capacitor,
the second switch is turned off when the charge is transferred from the photodiode to the first capacitor to store the buffered signal voltage at the first capacitor, and
the first reset voltage is read out from the second capacitor when the second switch is turned off; and
in a second read out period:
the second capacitor is reset to the second reset voltage after the first reset voltage is read out from the second capacitor, and
after the second capacitor is reset to the second reset voltage, the first switch is turned off while the second switch is turned on to disconnect the first capacitor from the second transistor, and to connect the first capacitor with the second capacitor in parallel and to generate the second voltage in the parallel combination of the first capacitor and the second capacitor.

21. The pixel of claim 20, wherein the current source is turned off during the second read out period.

* * * * *